(12) United States Patent
Kim et al.

(10) Patent No.: US 7,042,796 B2
(45) Date of Patent: May 9, 2006

(54) BANK COMMAND DECODER IN SEMICONDUCTOR MEMORY DEVICE

(75) Inventors: Cheol-Kyu Kim, Ichon-shi (KR); Ja-Seung Gou, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 42 days.

(21) Appl. No.: 10/877,557

(22) Filed: Jun. 24, 2004

(65) Prior Publication Data

US 2005/0099853 A1    May 12, 2005

(30) Foreign Application Priority Data

Nov. 10, 2003    (KR) .................. 10-2003-0079003

(51) Int. Cl.
*G11C 8/00*    (2006.01)
(52) U.S. Cl. .................. 365/230.06; 365/189.05; 365/230.08

(58) Field of Classification Search ........... 365/230.06, 365/189.305, 230.08, 189.05
See application file for complete search history.

(56) References Cited

U.S. PATENT DOCUMENTS

| | | | | | |
|---|---|---|---|---|---|
| 4,933,902 | A | * | 6/1990 | Yamada et al. | 365/189.08 |
| 5,469,387 | A | * | 11/1995 | Kim | 365/189.09 |
| 5,802,006 | A | * | 9/1998 | Ohta | 365/230.03 |
| 6,717,862 | B1 | * | 4/2004 | Naso et al. | 365/185.33 |
| 6,765,842 | B1 | * | 7/2004 | Kim | 365/230.03 |

* cited by examiner

*Primary Examiner*—Connie C. Yoha
(74) *Attorney, Agent, or Firm*—Blakely Sokoloff Taylor & Zafman

(57) ABSTRACT

An apparatus, included in a semiconductor memory device, for generating a bank control signal, includes a logic block for receiving an internal precharge signal and a power-up signal and outputting a first signal; and a latch block for latching an internal active signal and the first signal in order to generate the bank control signal.

8 Claims, 3 Drawing Sheets

BANK COMMAND DECODER IN SEMICONDUCTOR MEMORY DEVICE

FIELD OF INVENTION

The present invention relates to a semiconductor memory device; and, more particularly, to a command decoder, which is included in a semiconductor memory device, for generating a bank control signal.

DESCRIPTION OF PRIOR ART

Typically, a semiconductor memory device has a plurality of banks. The bank can be defined as a functional unit including a cell array, a plurality of sense amplifier, an address decoder and like this in order to independently or individually perform a data access operation without any influence of other's operation.

Herein, a data access operation of a conventional semiconductor memory device is described. For accessing a data stored in a cell of a bank, a word line corresponding with the cell should be activated after a bank active command as a kind of row control signals is inputted to the bank. Then, a read or write command as a kind of column control signals is inputted to the bank for sensing and amplifying the data supplied at a bit line. Finally, after accessing the data in the bank, a precharge command as a kind of column control signals is inputted for inactivating the word line in the bank.

At this time, the conventional semiconductor memory device generates a plurality of internal command signals such as /CS, /RAS, /CAS, /WE and etc. by logically combining a plurality of external command signals. Especially, a unit for generating the plurality of internal command signals is defined as a command decoder.

Hereinafter, a command decoder, which is for generating a bank control signal, among several functional units included in the conventional semiconductor memory device is described.

FIG. 1 is a schematic circuit diagram showing a bank active/precharge command decoder in accordance with an embodiment of the prior art.

As shown, the bank active/precharge command decoder includes a first PMOS transistor PM1, a first NMOS transistor NM1 and first to third inverters INV1 to INV3. The first PMOS transistor PM1 has a source coupled to a supply voltage VDD, a gate for receiving an internal active signal actz and a drain coupled to a node A. The first NMOS transistor NM1 also has a source coupled to a ground VSS, a gate for receiving an internal precharge signal pcg and a drain coupled to the node A. The first inverter INV1 receives a signal supplied at the node A. The first to second inverters INV1 to INV2, which are loop-connected to each other, are for latching the signal supplied at the node A. The third inverter INV3 inverts an output signal of the first inverter INV1 and outputs an inverse signal as a bank control signal bank_ctrl.

If the internal active signal actz is activated as a logic low level, the bank control signal bank_ctrl is a logic high level. Thus, a bank corresponding to the bank control signal bank_ctrl being a logic high level is activated.

Meanwhile, if the internal precharge signal pcg is activated as a logic high level after accessing a data in the bank, the bank control signal bank_ctrl is a logic low level. Thus, all word lines of the bank corresponding to the bank control signal bank_ctrl being a logic low level are precharged, i.e., initialized.

However, in the bank active/precharge command decoder, a voltage level at node A is not clearly determined directly after an external power is supplied to the semiconductor memory device (hereinafter, referred to a power-up operation). As a result, the semiconductor memory device falls into an error, e.g., undesirable activation of a bank. In order to solve this problem, the voltage level at node A is initialized during the power-up operation.

FIG. 2 is a schematic circuit diagram describing a bank active/precharge command decoder disclosed in a commonly owned copending application, Korean paten application No. 2003-75545, filed on Oct. 28, 2003, entitled "BANK CONTROL CIRCUIT OF A SEMICONDUCTOR MEMORY DEVICE", which is incorporated herein by reference.

As shown, as compared with the bank active/precharge command decoder shown in FIG. 1, the bank active/precharge command decoder further includes an initialization block 20. The initialization block 20 includes a fourth inverter INV4 and a second NMOS transistor NM2. The fourth inverter INV4 receives a power-up signal pwrup and outputs the inverse power-up signal to the second NMOS transistor NM2. The second NMOS transistor NM2 has a source coupled to the ground, a gate for receiving the inverse power-up signal outputted from the fourth inverter INV4 and a drain coupled to the node A.

Herein, the power-up signal pwrup is a logic low level during the power-up operation; but, if the external power is stabilized over a predetermined voltage level, the power-up signal pwrup becomes a logic high level.

In detail, at the power-up operation, the power-up signal pwrup is a logic low level. Thus, the second NMOS transistor NM2 is turned on; and the voltage of the node A is a logic low level, i.e., the node A is discharged. At this time, i.e., after accessing the data in the bank, the bank control signal bank_ctrl is a logic low level and all word lines of the bank corresponding to the bank control signal bank_ctrl being a logic high level are precharged, i.e., intialized.

On the other hand, if the external power is stabilized over the predetermined voltage level, the power-up signal pwrup becomes a logic high level. Thus, the second NMOS transistor NM2 is turned off; and the voltage of the node A is a logic low level until the internal active signal actz is activated as a logic low level.

Hereafter, like the operation of the bank active/precharge command decoder shown in FIG. 1, the bank active/precharge command decoder is operated according to the internal active signal actz and the internal precharge signal pcg.

Therefore, the semiconductor memory device can is prevented from the error, e.g., undesirable activation of a bank, by initializing the node A during the power-up operation.

However, when the voltage of the node A is a logic low level before the power-up signal pwrup is not supplied, a current path passing through the first PMOS transistor PM1 and the second NMOS transistor NM2 from the supply voltage VDD to the ground VSS has very low resistance. Therefore, an over-current flows the current path; and, as a result, not only the bank active/precharge command decoder but also a power supplier and etc. can be destroyed because of an over-heat generated by the over-current.

SUMMARY OF INVENTION

It is, therefore, an object of the present invention to provide a semiconductor memory device having a bank active/precharge command decoder which can prevent an error, e.g., undesirable activation of a bank, and block an over-current generation during a power-up operation and a bank initializing operation.

In accordance with an aspect of the present invention, there is provided a command decoder, included in a semiconductor memory device, for generating a bank control signal, including a logic block for receiving an internal precharge signal and a power-up signal and outputting a first signal; and a latch block for latching an internal active signal and the first signal in order to generating the bank control signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having a bank active/precharge command decoder according to the present invention will be described in detail referring to the accompanying drawings.

Figure 1:
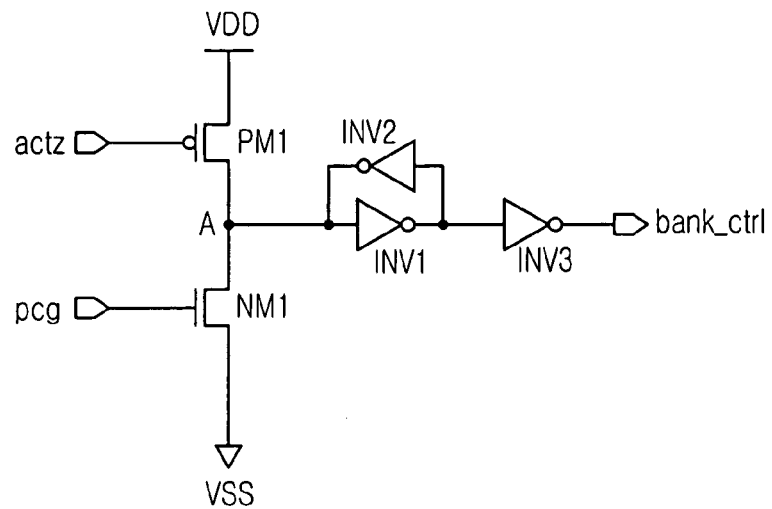
FIG. 1 is a schematic circuit diagram showing a bank active/precharge command decoder in accordance with an embodiment of the prior art.
Figure 2:
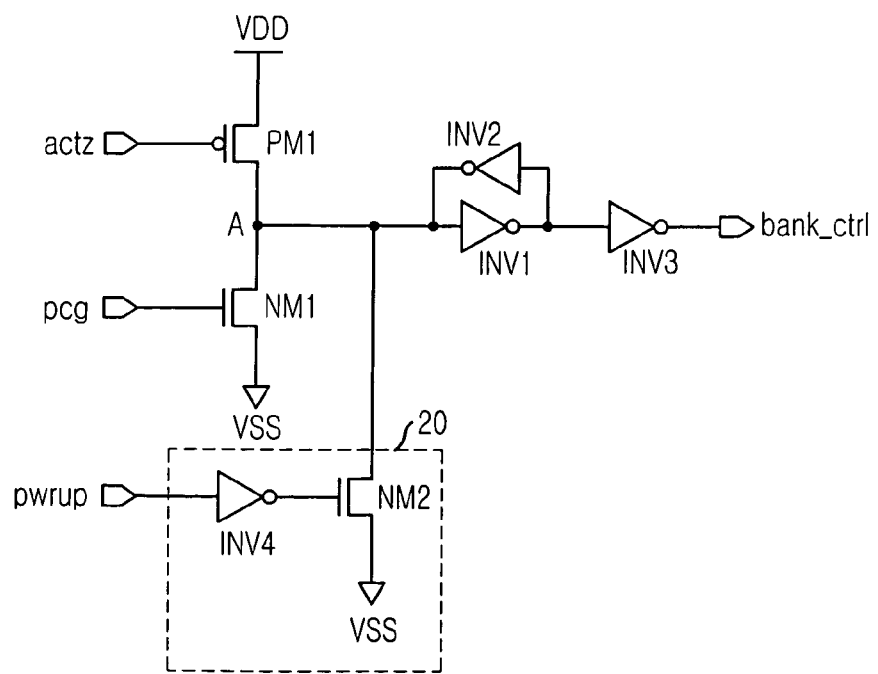
FIG. 2 is a schematic circuit diagram describing a bank active/precharge command decoder disclosed in a commonly owned copending application, Korean paten application No. 2003-75545, filed on Oct. 28, 2003, entitled "BANK CONTROL CIRCUIT OF A SEMICONDUCTOR MEMORY DEVICE", which is incorporated herein by reference.
Figure 3:
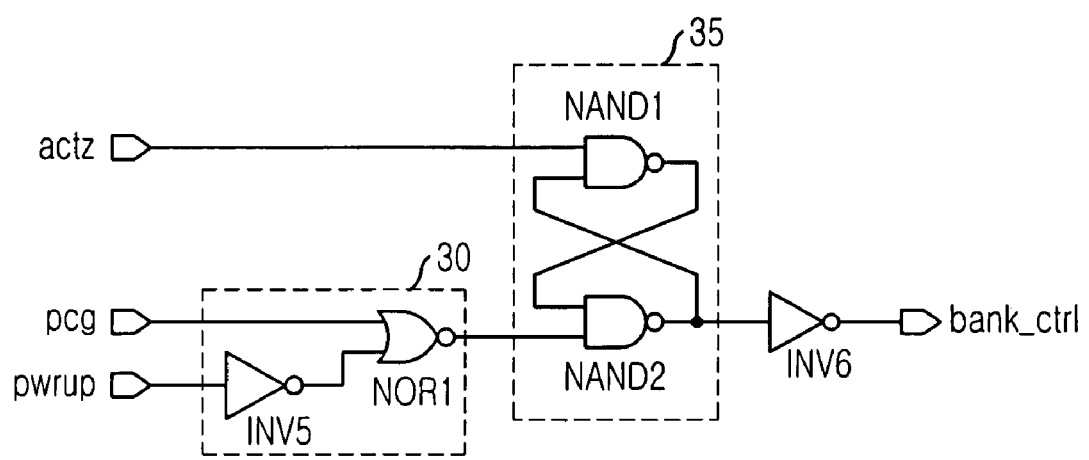
FIG. 3 is a schematic circuit diagram showing a bank active/precharge command decoder in accordance with the present invention.

FIG. 3 is a schematic circuit diagram showing a bank active/precharge command decoder in accordance with the present invention.

As shown, the bank active/precharge command decoder includes a logic block 30 and a latch block 35. The logic block 30, which includes a first inverter INV5 and a first NOR gate NOR1, receives an internal precharge signal pcg and a power-up signal pwrup and outputs a first signal (not shown) as a resultant signal of a predetermined logical combination. The first inverter INV5 inverts the power-up signal pwrup and outputs the inverse power-up signal to the first NOR gate NOR1. The first NOR gate NOR1 receives the internal precharge signal pcg and the inverse power-up signal outputted from the first inverter INV5 and outputs a resultant signal of a logical NOR operation to the latch block 35.

The latch block 35 is for latching the internal active signal actz and the first signal, i.e., the output signal of the logic block 30, in order to generate the bank control signal. The latch block 35 includes a first and a second NAND gates NAND1 and NAND2. The first NAND gate NAND1 receives an internal active signal actz. The second NAND gate NAND2 receives the first signal and an output signal of the first NAND gate and outputs a resultant signal as a bank control signal bank_ctrl. The first and second NAND gates NAND1 and NAND2 are crossly coupled to each other and the result signal is inputted to the first NAND gate NAND1.

Moreover, the bank active/precharge command decoder further includes at least one inverter, e.g., INV6, for inverting an output signal of the latch block 35, i.e., the bank control signal bank_ctrl. Herein, according to a structure of the latch block 35 and a method for operating a bank in the semiconductor memory device, the number of inverters like INV6 can be determined.

Figure 4:
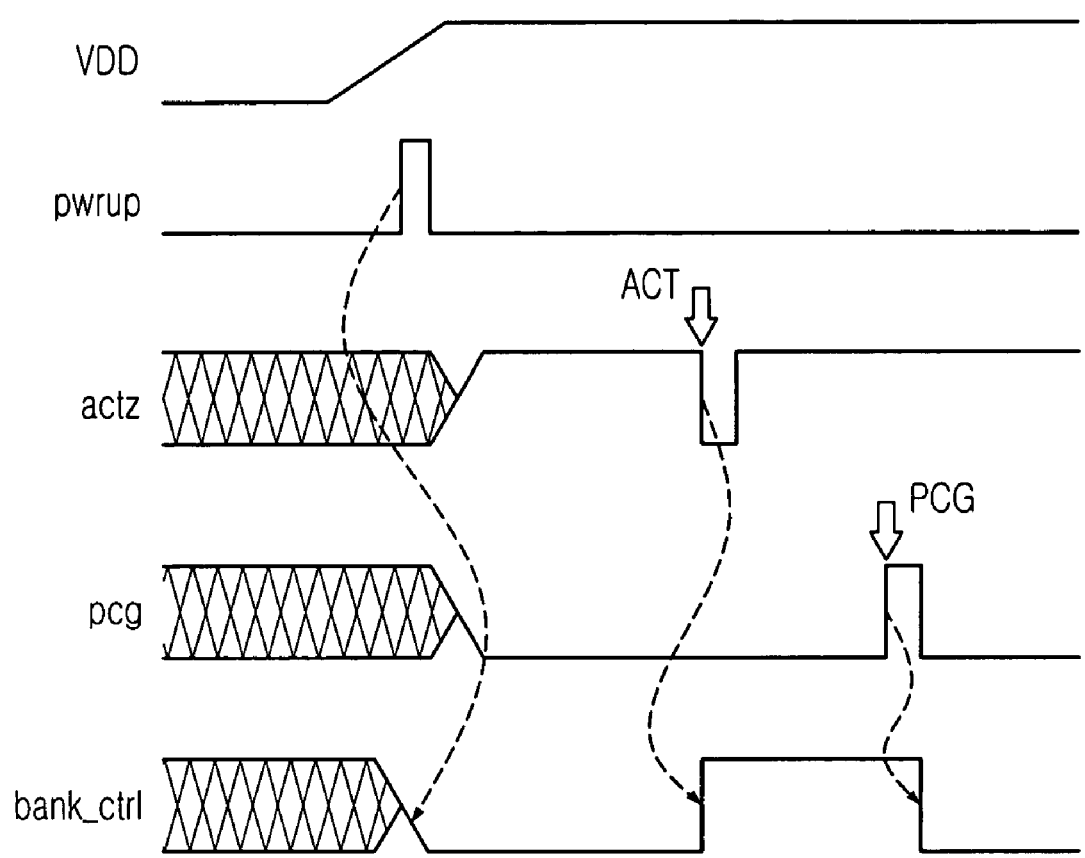
FIG. 4 is a waveform demonstrating an operating of the bank active/precharge command decoder shown in FIG. 3.

FIG. 4 is a waveform demonstrating an operating of the bank active/precharge command decoder shown in FIG. 3.

As shown, if the external power is supplied, the supply voltage VDD is going up. Herein, if the supply voltage VDD is increased over a predetermined level, the power-up signal pwrup is activated as a logic high level. At this time, i.e., the power-up operation, the internal active signal actz, the internal precharge signal pcg and the bank control signal bank_ctrl are undefined. After the supply voltage VDD is stabilized, the internal active signal actz is set as a logic high level and the internal precharge signal pcg is set as a logic low level.

In detail, if the power-up signal pwrup is activated as a logic high level, an output signal of the first NOR gate NOR1 becomes a logic high level regardless of the internal precharge signal pcg. As a result, the latch block 35 is reset and the bank control signal bank_ctrl is a logic low level. After this, even if the internal active signal actz is set as a logic high level and the internal precharge signal pcg is set as a logic low level, the bank control signal bank_ctrl keeps in a logic low level.

Then, if the internal active signal actz is activated as a logic low level after a row active command signal ACT is supplied, the latch block 35 is set and the bank control signal bank_ctrl becomes a logic high level. Next, if the internal precharge signal pcg is activated as a logic high level after a row precharge command signal PCG is supplied, the latch block 35 is reset and the bank control signal bank_ctrl becomes a logic low level.

As described above, the bank active/precharge command decoder in accordance with the present invention can prevent an error, e.g., undesirable activation of a bank, because the latch block 35 is initialized by the power-up signal pwrup and block an over-current generation during a power-up operation and a bank initializing operation by using the logic block 30 which performs a logic combination of the internal precharge signal pcg and the power-up signal pwrup.

Herein, though the logic block 30 includes the first NOR gate NOR1 and the first inverter INV5 in the described embodiment of the present invention, the logic block 30 can be constituted with other logic gates, e.g., a NAND gate, a XOR gate and like this. In addition, the latch block 35 can be constituted with other logic latches, e.g., a cross-coupled NOR latch and etc. as well as a cross-coupled NAND latch described in FIG. 3.

Namely, the bank active/precharge command decoder in accordance with the present invention prevents an error, e.g., undesirable activation of a bank, and blocks an over-current generation during a power-up operation and a bank initializing operation. As a result, there are improved an operation reliability and performance of the semiconductor memory device having the bank active/precharge command decoder.

The present application contains subject matter related to Korean patent application No. 2003-79003, filed in the Korean Patent Office on Nov. 10, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A command decoder, included in a semiconductor memory device, for generating a bank control signal, comprising:
    a logic block for receiving an internal precharge signal and a power-up signal and outputting a first signal in response to the internal precharge signal and the power-up signal; and
    a latch block for latching an internal active signal and the first signal in order to generate the bank control signal being activated in response to the internal active signal and being inactivated in response to the first signal.

2. The command decoder as recited in claim 1, further comprising an inverter for inverting the bank control signal outputted from the latch block.

3. The command decoder as recited in claim 1, wherein the logic block includes:
    an inverter for inverting the power-up signal; and
    a NOR gate for receiving the internal precharge signal and an output signal of the inverter and outputting a first signal.

4. The command decoder as recited in claim 1, wherein the latch block includes:
    a first NAND gate for receiving the internal active signal; and
    a second NAND gate for receiving the first signal and an output signal of the first NAND gate and outputting a result signal as the bank control signal,
    wherein the first and second NAND gates are crossly coupled to each other and the result signal is inputted to the first NAND gate.

5. The command decoder as recited in claim 1, wherein the internal precharge signal is activated if the internal precharge signal is a logic high level.

6. The command decoder as recited in claim 1, wherein the power-up signal is activated to a logic high level.

7. The command decoder as recited in claim 1, wherein the internal active signal is activated to a logic low level.

8. The command decoder as recited in claim 1, wherein the first signal is activated in response to the internal precharge signal after the power-up signal is activated.

* * * * *